US008817528B2

(12) United States Patent
Otto et al.

(10) Patent No.: US 8,817,528 B2
(45) Date of Patent: Aug. 26, 2014

(54) DEVICE COMPRISING A PLURALITY OF STATIC RANDOM ACCESS MEMORY CELLS AND METHOD OF OPERATION THEREOF

(75) Inventors: Michael Otto, Weinboehla (DE); Nigel Chan, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 210 days.

(21) Appl. No.: 13/588,327

(22) Filed: Aug. 17, 2012

(65) Prior Publication Data

US 2014/0050017 A1 Feb. 20, 2014

(51) Int. Cl.
*G11C 11/00* (2006.01)

(52) U.S. Cl.
USPC ..................................... 365/154; 365/189.16

(58) Field of Classification Search
CPC ....... G11C 11/413; G11C 11/419; G11C 7/12
USPC ............................................ 365/154, 189.16
See application file for complete search history.

(56) References Cited

U.S. PATENT DOCUMENTS

| 5,668,770 | A  | * | 9/1997 | Itoh et al. ....................... 365/227 |
| 7,733,687 | B2 | * | 6/2010 | Kengeri et al. ................ 365/154 |
| 8,330,496 | B2 | * | 12/2012 | Yamaoka et al. .............. 326/113 |
| 2009/0207675 | A1 | * | 8/2009 | Kengeri et al. .......... 365/189.14 |
| 2010/0061169 | A1 | * | 3/2010 | Yamaoka et al. .............. 365/203 |
| 2011/0211408 | A1 | * | 9/2011 | Koike et al. .................... 365/203 |
| 2011/0235439 | A1 | * | 9/2011 | Itoh et al. ................. 365/189.06 |

* cited by examiner

*Primary Examiner* — Tuan T Nguyen
(74) *Attorney, Agent, or Firm* — Amerson Law Firm, PLLC

(57) ABSTRACT

A method comprises writing data to one or more static random access memory (SRAM) cells. Writing data to the one or more SRAM cells comprises applying a first data signal to at least one bit line electrically connected to the one or more SRAM memory cells, electrically disconnecting at least one of a first power supply terminal and a second power supply terminal of each of the one or more SRAM cells from a power supply and applying a word line signal to a word line electrically connected to the one or more SRAM cells. Thereafter, the at least one of the first power supply terminal and the second power supply terminal of each of the one or more SRAM cells is electrically connected to the power source.

20 Claims, 5 Drawing Sheets

DEVICE COMPRISING A PLURALITY OF STATIC RANDOM ACCESS MEMORY CELLS AND METHOD OF OPERATION THEREOF

BACKGROUND OF THE INVENTION

1. Field of the Invention

Generally, the present disclosure relates to the field of integrated circuits, and, more particularly, to integrated circuits comprising static random access memory devices.

2. Description of the Related Art

Types of semiconductor memory include dynamic random access memory (DRAM) and static random access memory (SRAM). DRAM comprises memory cells having a relatively simple structure, in particular memory cells wherein an amount of charge stored in a capacity is used to represent a bit of information. Due to the simple structure of DRAM cells, a high density of integration can be obtained. However, due to leakage currents in the capacities, DRAM typically requires constant refresh cycles to avoid a loss of information.

In SRAM devices, cross-coupled inverters are used for storing information. In SRAM devices, refresh cycles need not be performed, and they typically allow a greater speed of operation than DRAM devices. However, SRAM comprises memory cells which typically have a more complex structure than the memory cells of DRAM devices, which may limit the density of integration that can be obtained in SRAM devices.

An SRAM device 100 will be described with reference to FIG. 1. The SRAM device 100 comprises an SRAM cell 101, a bit line 102, an inverse bit line 103, a word line 104, a high voltage power supply line 105 and a low voltage power supply line 106.

In the operation of the device 100, the high voltage power supply line 105 can be maintained at a higher voltage than the low voltage power supply line 106. Accordingly, the voltage of the high voltage power supply line 105 will be denoted as "high voltage" and the voltage of the low voltage power supply line 106 will be denoted as "low voltage," although the high voltage is typically on an order of magnitude of a few volts.

The SRAM cell 101 comprises a first inverter 107 having an input 113 and an output 111, and a second inverter 108 having an input 114 and output 112. The output 111 of the first inverter 107 is electrically connected to the input 114 of the second inverter 108, and the output 112 of the second inverter 108 is electrically connected to the input 113 of the first inverter 107.

Each of the inverters 107, 108 comprises a pull-up transistor, wherein the pull-up transistor of the first inverter 107 is denoted by reference numeral 115, and the pull-up transistor of the second inverter 108 is denoted by reference numeral 116. Moreover, each of the inverters 107, 108 comprises a pull-down transistor, wherein reference numeral 117 denotes the pull-down transistor of the first inverter 107, and reference numeral 118 denotes the pull-down transistor of the second inverter 108.

The pull-up transistors 115, 116 may be P-channel transistors, which may be switched from an on state, wherein they have a relatively high conductivity, to an off state, wherein there is only a relatively low leakage conductivity, by applying the high voltage to their gate electrodes. The pull-down transistors 117, 118 may be N-channel transistors which may be switched from an off state, wherein there is only a relatively low leakage conductivity, to an on state, wherein they have a relatively high conductivity, by applying the high voltage to their gate electrodes.

The SRAM cell 101 further comprises pass-gate transistors 109, 110. The pass-gate transistor 109 is electrically connected between the inverse bit line 103 and the output 111 of the first inverter, and the second pass-gate transistor 110 is electrically connected between the bit line 102 and the output 112 of the second inverter 108. Gate electrodes of the pass-gate transistors 109, 110 are electrically connected to the word line 104. The pass-gate transistors 109, 110 may be N-channel transistors which may be switched from an off state to an on state by applying the high voltage to their gate electrodes. Accordingly, if the high voltage is applied to the word line 104, an electrical connection is established between the inverse bit line 103 and the output 111 of the first inverter, and between the bit line 102 and the output 112 of the second inverter 108.

The device 100 may comprise a plurality of SRAM cells having a structure corresponding to the structure of SRAM cell 101, and may also comprise a plurality of low voltage power supply lines similar to power supply lines 105, 106, a plurality of word lines similar to word line 104, and a plurality of bit lines and inverse bit lines similar to bit line 102 and inverse bit line 103. Typically, there is an array 120 of SRAM cells having rows and columns of SRAM cells, wherein the power supply lines and word lines extend along the rows of the array, and the bit lines and inverse bit lines extend along the columns of the array. Individual SRAM cells of the device 100 may be addressed by applying the high voltage to the word line to which the SRAM cell is connected to switch the pass-gate transistors of the respective cell into the on state and by applying and/or reading voltages from the bit line and the inverse bit line to which the SRAM cell is connected. The other word lines may be maintained at the low voltage. Bit lines and inverse bit lines are typically kept at the high voltage during standby mode and are left electrically floating during reading.

The SRAM cell 101 may have three modes of operation. In a standby mode, the voltage of word line 104 is low, so that pass-gate transistors 109, 110 are in the off state and the inverters 107, 108 are electrically disconnected from bit line 102 and inverse bit line 103. Since the output 111 of the first inverter 107 is electrically connected to the input 114 of the second inverter 108, and the output 112 of the second inverter 108 is electrically connected to the input 113 of the first inverter 107, the inverters 107, 108 can reinforce each other, so that they substantially maintain their respective state. Accordingly, there is a first state of the SRAM cell 101, wherein the output 111 of the first inverter 107 is substantially at the low voltage and the output 112 of the second inverter 108 is substantially at the high voltage, and a second state, wherein the output 111 of the first inverter 107 is substantially at the high voltage, and the output 112 of the second inverter 108 is substantially at the low voltage. These two states may be used to store one bit of information.

For reading the bit of information stored in the SRAM cell 101, the bit line 102 and the inverse bit line 103 may be pre-charged to the high voltage. Then, the bit line 102 and the inverse bit line 103 are left electrically floating and the word line 104 is switched from low voltage to high voltage, so that the pass-gate transistors 109, 110 establish an electrical connection between the bit line 102 and the output 112 of the second inverter 108, and an electrical connection between the inverse bit line 103 and the output 111 of the first inverter 107. Depending on the state of the SRAM cell 101, a voltage difference between the bit line 102 and the inverse bit line 103 is created, which can be sensed by a sense amplifier (not shown) to determine the state of SRAM cell 101.

An issue in reading data from SRAM cell 101 can be avoiding the occurrence of a read disturbance wherein the state of the SRAM cell 101 is inadvertently flipped during the read operation. The stability of the SRAM cell 101 with respect to a read disturbance may be dependent on the so-called beta ratio between the conductivity of pull-down transistors 117, 118 in the on state and the conductivity of pass-gate transistors 109, 110 in the on state. A greater beta ratio may be helpful for increasing the stability of SRAM cell 101 with respect to read disturbances. Since the conductivity of a channel of a field effect transistor in the on state typically increases with an increasing width of the channel of the transistor, from the point of view of stability during the read operation, it may be of advantage if a width of the channel regions of the pass-gate transistors 109, 110 is relatively low compared to a width of the channel regions of the pull-down transistors 117, 118.

For writing data to the SRAM cell 101, the high voltage may be applied to one of the bit line 102 and the inverse bit line 103, and the low voltage may be applied to the other one of the bit line 102 and the inverse bit line 103, depending on the state of the SRAM cell 101 to be obtained after the write operation. Thereafter, the voltage of the word line 104 may be switched from low to high to switch the pass-gate transistors 109, 110 into the on state. Thereby, the voltages applied to the bit line 102 and the inverse bit line 103 are applied to the inputs 113, 114 of the inverters 107, 108. If the initial state of SRAM cell 101 is different from the state to be written to SRAM cell 101, this typically causes the inverters 107, 108 to change their state.

An issue in writing data to SRAM cell 101 can be avoiding a write failure, wherein the SRAM cell 101 does not change its state, although the state to be written to the SRAM cell 101 is different from the initial state. The likelihood of a write failure occurring may be related to a ratio between a conductivity of pass-gate transistors 109, 110 in the on state, and a conductivity of pull-up transistors 115, 116 in the on state, which is denoted as "gamma ratio." In general, a greater gamma ratio may reduce the likelihood of a write failure occurring.

Accordingly, for avoiding write failures, it may be advantageous if the conductivities of the pass-gate transistors 109, 110 in the on state (and, accordingly, a width of the channel regions of these transistors) are relatively large compared to the conductivities of the pull-up transistors 115, 116 in the on state (and, accordingly, a width of the channel regions of these transistors).

Hence, there may be a trade off between the stability of SRAM cell 101 with respect to read disturbances, and a writability of the SRAM cell 101, which is related to the occurrence of write failures occurring. A greater conductivity of the pass-gate transistors 109, 110 in the on state may be helpful for reducing the likelihood of write failures occurring, but, at the same time, may increase the likelihood of read disturbances.

For avoiding these issues, it has been proposed to modify the design of SRAM cells by separating the write and read path though an additional port. However, such solutions typically require two additional transistors per SRAM cell, and also require an additional read word line per row of the device 100, as well as an additional read bit line per column of the device 100. This can substantially increase the area of the device 100 that is required for storing one bit of information.

In view of the situation described above, the present disclosure is related to a method of writing data to one or more SRAM cells and a device comprising a plurality SRAM cells that allows obtaining a relatively high stability with respect to read disturbances and a relatively low likelihood of write failures occurring, while substantially avoiding or at least reducing an increase of the area of the device required for storing one bit of information.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative method disclosed herein comprises writing data to one or more static access random memory (SRAM) cells. Writing data to the one or more SRAM cells comprises applying a data signal to at least one bit line electrically connected to the one or more SRAM memory cells, electrically disconnecting at least one of a first power supply terminal and a second power supply terminal of each of the one or more SRAM cells from a power supply, and applying a word line signal to a word line connected to the one or more SRAM cells. Thereafter, the at least one of the first power supply terminal and the second power supply terminal of each of the one or more SRAM cells is electrically connected to the power source.

An illustrative device as disclosed herein comprises a plurality of bit lines, a plurality of word lines, a plurality of static random access memory (SRAM) cells, a plurality of first switching devices and a data writing circuit. Each SRAM cell is electrically connected to one of the bit lines and one of the word lines. Moreover, each SRAM cell has a first power supply terminal and a second power supply terminal. Each first switching device is electrically connected between the first power supply terminal of at least one of the SRAM cells and a power source. The data writing circuit is adapted for applying a data signal to each bit line connected to the at least one of the SRAM cells, operating at least one of the first switching devices for electrically disconnecting the first power supply terminal of at least one of the plurality of SRAM cells from the power source, and applying a word line signal to a word line connected to the at least one of the SRAM cells.

BRIEF DESCRIPTION OF THE DRAWINGS

The disclosure may be understood by reference to the following description taken in conjunction with the accompanying drawings, in which like reference numerals identify like elements, and in which.

Figure 1:
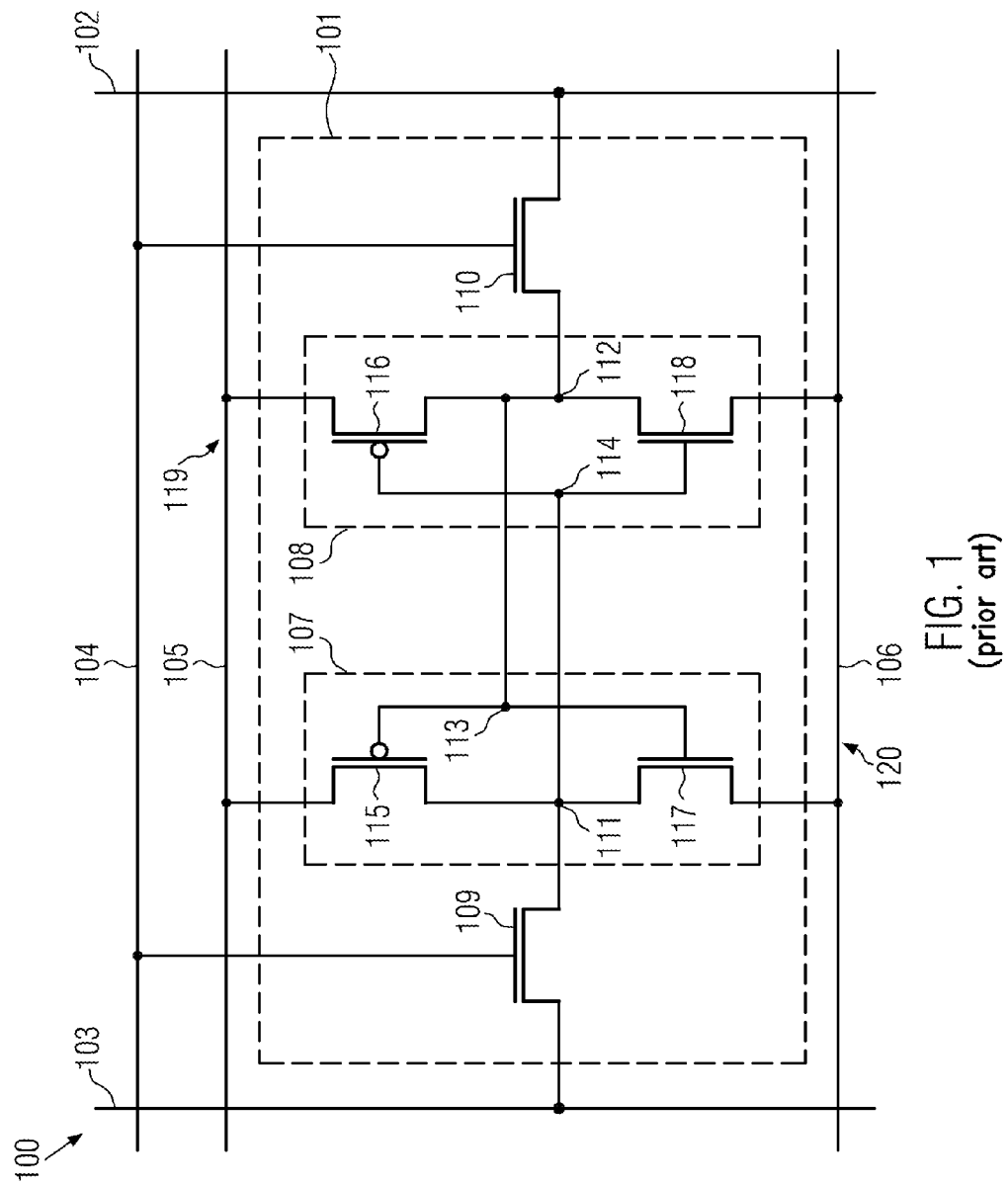
FIG. 1 schematically illustrates an SRAM device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments provide devices comprising SRAM cells and methods for operating devices comprising SRAM cells with an enable function that allows disconnecting a high voltage (sometimes denoted as "VDDA") provided by a power supply and/or a low voltage (sometimes denoted as "VSS") provided by the power supply from SRAM cells during a write operation. In this case, the data writing circuit does not need to overpower pull-up transistors and pull-down transistors of the SRAM cells. During a read operation, wherein data are read from the device, the power supply can remain connected to the SRAM cells.

In embodiments, VDDA and/or VSS segmentation along word lines of the device may be used. Thus, all cells along an activated word line may be written simultaneously, while the other cells of the device may remain in the standby mode. The disconnection of VDDA and/or VSS may be achieved by a single transistor per word line domain (if one of VDDA and VSS is disconnected during the write operation) or two transistors per word line domain (if both VDDA and VSS are disconnected during the write operation). For disconnecting VDDA, a P-channel transistor may be used, and an N-channel transistor may be used for disconnecting VSS. Since P-channel transistors may be switched from an electrically conductive on-state to a substantially nonconductive off-state if a high voltage is applied to their gate electrode, and N-channel transistors may be switched from a substantially nonconductive off-state to an on-state if a high voltage is applied to the gate electrode, signals applied to gate electrodes of the P-channel transistors may be inverse to signals applied to gate electrodes of the N-channel transistors so that a low voltage is applied to the gate electrode of the P-channel transistor associated with a specific word line domain when a high voltage signal is applied to the gate electrode of the N-channel transistor of the word line domain, and vice versa.

By disconnecting the SRAM cells from VDDA and/or VSS during the write operation, the influence of device targeting on the writability of the SRAM cell may be eliminated or at least reduced. Accordingly, the SRAM cells may be optimized for stability with respect to read disturbances, while substantially avoiding or at least reducing an adverse influence on the writability of the SRAM cells. Since, for doing so, no additional transistors are needed in individual SRAM cells, substantially no additional area is needed for the individual SRAM cells.

In some embodiments, the enable signal for disconnecting the SRAM cells from VDDA and VSS and a word line signal for switching the pass-gate transistors of these SRAM cells into the on-state may be applied substantially simultaneously. In other embodiments, a separate timing may be used for the enable signal and the word line signal, wherein the word line signal may be applied later than the enable signal. This may help to further improve the writability of the SRAM cells, since the voltage difference between the high voltage side and the low voltage side of the SRAM cells may decrease in the time interval between the point of time at which the enable signal is applied and the point of time at which the word line signal is applied.

Figure 2:
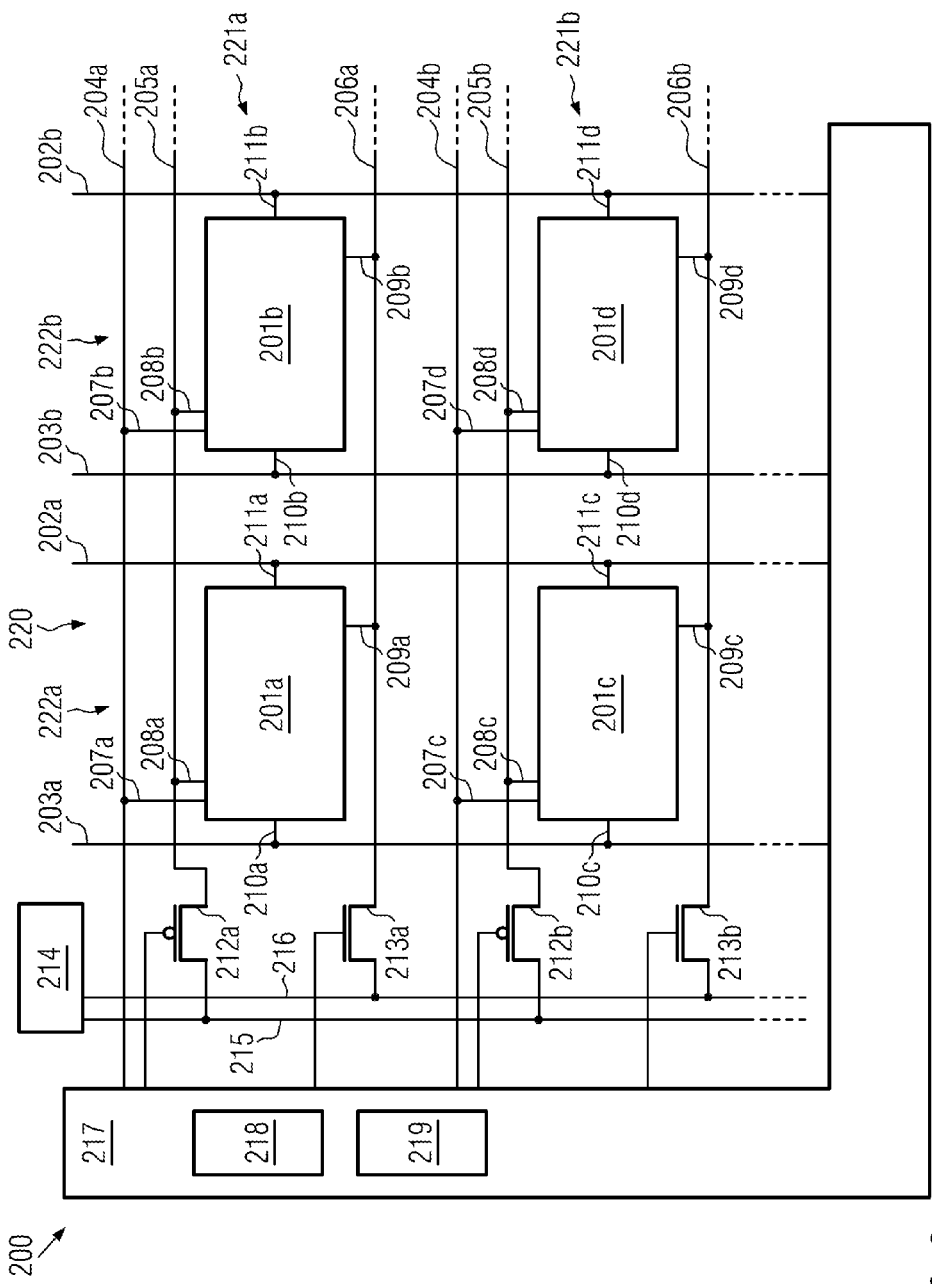
FIG. 2 schematically illustrates a device according to an embodiment.

Further embodiments will be described with respect to FIGS. 2, 3, 4a and 4b. FIG. 2 schematically illustrates a device 200 according to an embodiment comprising an array 220 of SRAM cells 201a, 201b, 201c and 201d.

The array 220 comprises a plurality of rows 221a, 221b, wherein row 221a comprises SRAM cells 201a, 201b, and row 221b comprises SRAM cells 201c, 201d. The array 220 further comprises a plurality of columns 222a, 222b, wherein SRAM cells 201a, 201c are provided in column 222a, and SRAM cells 201b, 201d are provided in column 222b. Accordingly, each of the SRAM cells 201a-201d is located in one row of the array 220 and in one column of the array 220.

The device 200 need not comprise four SRAM cells, as shown in FIG. 2. In embodiments, a greater number of SRAM cells may be provided, and the array 220 may comprise more than two rows and more than two columns.

The device 200 comprises a plurality of word lines 204a, 204b, wherein each word line is associated with one of the rows 221a, 221b of the array 220. In particular, word line 204a is associated with row 221a, and word line 204b is associated with row 221b. Each of the SRAM cells 201a-201d is electrically connected to the word line associated with the row wherein the SRAM cell is provided. In particular, SRAM cells 201a, 201b are electrically connected to word line 204a associated with the row 221a by word line connections 207a and 207b, respectively, and SRAM cells 201c, 201d are electrically connected to word line 204b associated with row 221b by word line connections 207c, 207d.

The device 200 further comprises a plurality of high voltage power supply lines 205a, 205b. Each high voltage power supply line is associated with one of the rows 221a, 221b of the array 220. In particular, high voltage power supply line 205a is associated with row 221a, and high voltage power supply line 205b is associated with row 221b. Each of the SRAM cells 201a-201d is electrically connected to the high voltage power supply line associated with the row wherein the SRAM cell is provided. In particular, SRAM cells 201a, 201b are electrically connected to high voltage power supply line 205a by first power supply terminals 208a and 208b, respectively, and SRAM cells 201c, 201d are connected to the high voltage power supply line 205b by first power supply terminals 208c and 208d, respectively.

The device 200 further comprises a plurality of low voltage power supply lines 206a, 206b. Each low voltage power supply line is associated with one of the rows 221a, 221b. In particular, low voltage power supply line 206a is associated with row 221a and low voltage power supply line 206b is associated with row 221b.

Each of the SRAM cells 201a-201d is electrically connected to one of the low voltage power supply lines 206a, 206b, associated with the row wherein the SRAM cell is provided. In particular, SRAM cells 201a, 201b are electrically connected to low voltage power supply line 206a associated with the row 221a by second power supply terminals 209a and 209b, respectively, and SRAM cells 201c, 201d are electrically connected to low voltage power supply line 206b by second power supply terminals 209c and 209d, respectively.

The device 200 further comprises a plurality of bit lines 202a, 202b and a plurality of inverse bit lines 203a, 203b, each bit line and each inverse bit line being associated with one of the columns 222a, 222b of the array 220. In particular, bit line 202a and inverse bit line 203a are associated with column 222a, and bit line 202b and inverse bit line 203b are associated with column 222b. Each of the SRAM cells 201a-201d is electrically connected to a bit line associated with the column wherein the SRAM cell is provided and one of the inverse bit lines associated with the column wherein the SRAM cell is provided. In particular, SRAM cells 201a and 201c are electrically connected to bit line 202a associated with column 222a by bit line terminals 211a and 211c, respectively, and are electrically connected to inverse bit line 203a by inverse bit line terminals 210a and 210c, respectively. SRAM cells 201b and 201d are electrically connected to bit line 202b by bit line terminals 211b and 211d, respectively, and are electrically connected to inverse bit line 203b by inverse bit line terminals 210b and 210d, respectively.

The device 200 further comprises a plurality of high voltage switching devices 212a, 212b. Each of the high voltage switching devices 212a, 212b is electrically connected between one of the high voltage power supply lines 205a, 205b and a high voltage terminal 215 of a power source 214. In particular, high voltage switching device 212a is electrically connected between high voltage terminal 215 and high voltage power supply line 205a, and high voltage switching device 212b is electrically connected between high voltage terminal 215 and high voltage power supply line 205b. Accordingly, there is one high voltage switching device associated with each of the rows 221a, 221b of the array 220. In embodiments, the high voltage switching devices 212a, 212b may be P-channel field effect transistors.

The device 200 further comprises a plurality of low voltage switching devices 213a, 213b which, in embodiments, may be N-channel field effect transistors. Each of the low voltage switching devices 213a, 213b is electrically connected between a low voltage terminal 216 of power supply 214 and one of the low voltage power supply lines 206a, 206b. In particular, low voltage switching device 213a is electrically connected between low voltage terminal 216 and low voltage power supply line 206a, and low voltage switching device 213b is electrically connected between low voltage terminal 216 and low voltage power supply line 206b. Accordingly, each of the low voltage switching devices is associated with one of the rows 221a, 221b of the array 220.

Further high voltage switching devices and low voltage switching devices may be associated with other rows of array 220 which are not shown in FIG. 2.

The device 200 further comprises a control circuit 217 that is electrically connected to the word lines 204a, 204b, the bit lines 202a, 202b and the inverse bit lines 203a, 203b, and is adapted for controlling voltages applied thereto. Furthermore, the control circuit is electrically connected to the high voltage switching devices 212a, 212b and the low voltage switching devices 213a, 213b for switching the high voltage switching devices 212a, 212b and the low voltage switching devices 213a, 213b between an electrically conductive on-state and a substantially nonconductive off-state. Accordingly, the control circuit 217 may be adapted for connecting and disconnecting an electrical connection between the high voltage power supply lines 205a, 205b and the high voltage terminal 215 of power supply 214 by operating the high voltage switching devices 212a, 212b, wherein each of the high voltage power supply lines 205a, 205b may be electrically disconnected from the high voltage terminal 215 individually by operating the respective high voltage switching device.

Similarly, the control circuit 217 may be adapted for operating the low voltage switching devices 213a, 213b for connecting and disconnecting an electrical connection between the low voltage power supply lines 206a, 206b and the low voltage terminal 216 of the power supply 214, wherein each of the low voltage power supply lines 206a, 206b may be electrically disconnected from the low voltage terminal 216 individually by operating the respective low voltage switching device.

In embodiments wherein the high voltage switching devices 212a, 212b comprise P-channel field effect transistors and the low voltage switching devices 213a, 213b comprise N-channel field effect transistors, the control circuit 217 may be connected to the gate electrodes of the switching devices 212a, 212b, 213a, 213b. The high voltage switching devices 212a, 212b may be switched from the on-state to the off-state by increasing the voltage applied to the gate electrode, for example by switching the voltage applied to the gate electrode from the low voltage provided from power source 214 to the high voltage provided by the power source 214. The N-channel transistors of the low voltage switching devices 213a, 213b may be switched from the on-state to the off-state by reducing the voltage applied to the gate electrode thereto, for example from switching from the high voltage provided by the power supply 214 to the low voltage provided by the power supply 214.

The control circuit 217 may comprise a write control circuit 218 and a read control circuit 219, as schematically indicated in FIG. 2. In embodiments, some components of the control circuit 217 may be shared between the read control circuit 218 and the write control circuit 219, and optionally further elements of the control circuit.

In embodiments, the high voltage provided by the power supply 214 may be in a range from about 0.5-2.0 V, and the low voltage provided by the power supply 214 may be about 0 V. In some embodiments, the voltage levels may be adapted to a mode of operation, for example in accordance with temperature and/or power saving requirements. The configuration of SRAM cell 201a according to an embodiment will be described with reference to FIG. 3.

The SRAM cell 201a has a high voltage power supply terminal 208a and a low voltage power supply terminal 209a. The SRAM cell 201a further comprises a first inverter 307 and a second inverter 308. The high voltage power supply terminal 208a is provided on a high voltage side of the inverters 307, 308, and the low voltage power supply terminal 209a is provided on a low voltage side of the inverters 307, 308.

Figure 3:
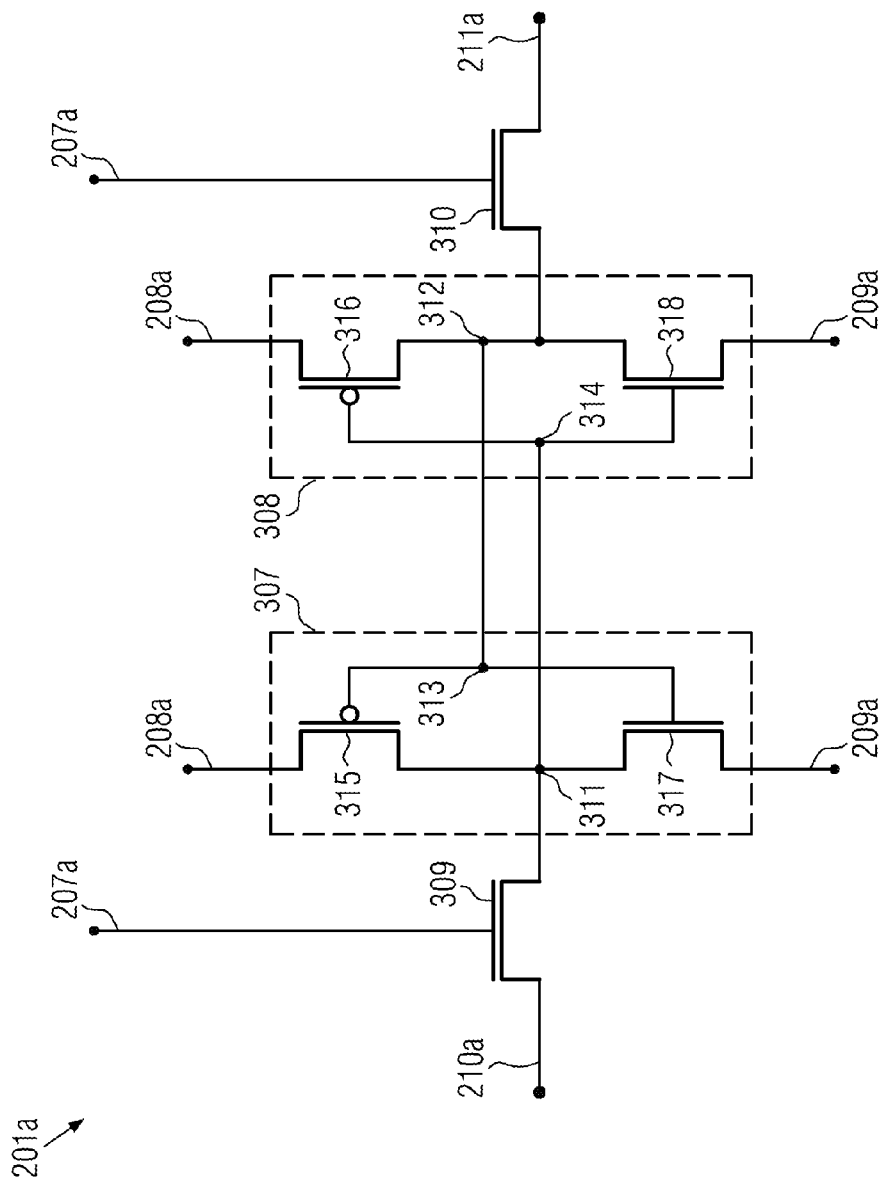
FIG. 3 schematically illustrates an SRAM cell of the device shown in FIG. 2.

In embodiments, the high voltage power supply terminal 208a may be provided in the form of two separate electrically conductive features, for example electrically conductive lines in an integrated circuit, as schematically shown in FIG. 3, wherein one electrically conductive feature connects the first inverter 307 to the high voltage power supply line 205a, and the other electrically conductive feature connects the second inverter 308 to the high voltage power supply line 205a.

Similarly, in embodiments, the low voltage power supply terminal 209a may be provided in the form of two separate electrically conductive features, for example electrically conductive lines in an integrated circuit, which connect the low voltage sides of inverters 307, 308 to the low voltage power supply line 206a.

In other embodiments, the high voltage power supply terminal 208a may be provided in the form of a single electrically conductive feature and/or the low voltage power supply terminal 209a may be provided in the form of a single electrically conductive feature.

The first inverter 307 comprises a pull-up transistor 315, which may be a P-channel field effect transistor and a pull-down transistor 317, which may be an N-channel field effect transistor. The first inverter 307 comprises an output 311. A pass-gate transistor 309 is electrically connected between the inverse bit line terminal 210a and the output 311 of the first inverter 307. The gate of pass-gate transistor 309 is electrically connected to the word line connection 207a.

Similarly, the second inverter 308 has an output 312, an input 314, a pull-up transistor 316 and a pull-down transistor 318. A pass-gate transistor 310 is electrically connected between the output 312 and the bit line terminal 211a, a gate electrode of the pass-gate transistor 310 being electrically connected to the word line connection 207a.

Similar to the power supply terminals 208a, 209a, the word line connection 207a may comprise two separate electrically conductive features providing an electrical connection between the gate electrodes of pass-gate transistors 309, 310 and the word line 204a, or the word line connection 207a may be provided in the form of a single electrically conductive feature.

The output 311 of the first inverter 307 is electrically connected to an input 314 of the second inverter 308, and the output 312 of the second inverter 308 is electrically connected to an input 313 of the first inverter 307.

The SRAM cell 201a is formed by six transistors (two pull-up transistors 315, 316, two pull-down transistors 317, 318 and two pass-gate transistors 309, 310). Accordingly, SRAM cell 201a is a six transistor SRAM cell.

Further features of SRAM cell 201a may correspond to those of SRAM cell 101 described above with reference to FIG. 1.

The SRAM cells 201b, 201c, 201d and optional further SRAM cells of device 200 may have a configuration corresponding to the configuration of SRAM cell 201a.

In the following, the operation of device 200 according to an embodiment will be described with reference to FIG. 4a.

Figure 4A:
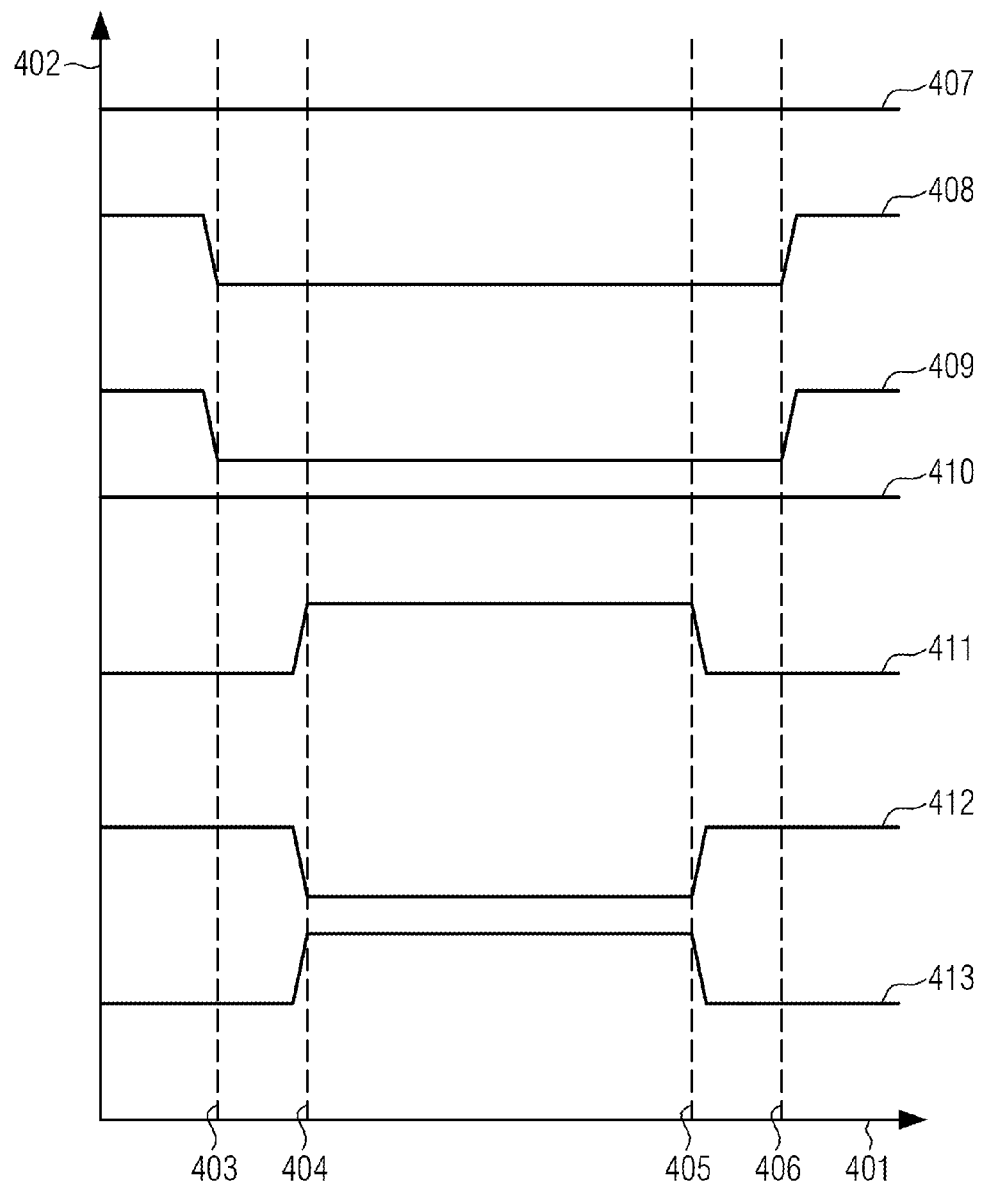
FIG. 4a schematically illustrates signals applied in a method of operating the device of FIG. 2 according to an embodiment.

FIG. 4a is a graph illustrating signals which may be applied in the device 200 when data are written to SRAM cells. A first coordinate axis 401 denotes time, and a second coordinate axis 402 denotes a voltage of the signals. For simplicity, in FIG. 4a, curves showing the voltage of signals have been shifted in the vertical direction, so that there is no overlap between the curves. Each of the signals shown in FIG. 4a may have a voltage substantially equal to the low voltage provided by the power source 214 or a voltage substantially equal to the high voltage provided by the power source 214, and optionally may be switched between the low voltage and the high voltage.

Accordingly, in FIG. 4a, a rising edge of a signal indicates a transition from the low voltage to the high voltage, and a falling edge indicates a transition from the high voltage to the low voltage.

FIG. 4a shows an illustrative embodiment wherein data are written to SRAM cells 201a, 201b in the row 221a of the array 220 of SRAM cells.

During a time interval between a point of time 403 and a point of time 406, a data signal 407 is applied to bit line 202a, and a data signal 409 is applied to bit line 202b. The signals 407, 409 correspond to data which are to be written to SRAM cells 201a, 201b.

In FIG. 4a, a situation is shown wherein the state of SRAM cell 201a to be obtained in the write procedure is a state wherein the output of the second inverter of SRAM cell 201a (that is electrically connected to bit line 202a) is at the high voltage, and the state of SRAM cell 201b to be obtained is a state wherein the output of the second inverter of SRAM cell 201b (that is electrically connected to bit line 202b) is at the low voltage.

Before the point of time 403 and after the point of time 406, bit lines 202a, 202b may be at the high voltage. The voltages applied to bit lines 202a, 202b in the time interval between the points of time 403, 406 correspond to the voltages of the outputs of the second inverters of SRAM cells 201a, 201b to be obtained after the writing procedure. Hence, in the example shown in FIG. 4a, data signal 407 remains at the high voltage, and data signal 409 is switched from the high voltage to the low voltage during the time interval.

If the state of SRAM cell 201a to be obtained after writing data to SRAM cell 201a were a state wherein the output of the second inverter of SRAM cell 201a is at the low voltage, the bit line 202a would be switched to the low voltage during the time interval between point of time 403 and point of time 406, and if the state of SRAM cell 201b to be obtained after the write procedure would be a state wherein the output of the second inverter of SRAM cell 201b is at the high voltage, bit line 202b would be maintained at the high voltage during the time interval.

During the time interval from point of time 403 to point of time 406, an inverse data signal 408 may be applied to inverse bit line 203a, and an inverse data signal 410 may be applied to inverse bit line 203b. Inverse data signal 408 is inverse to data signal 407, wherein inverse data signal 408 is low if data signal 407 is high, and inverse data signal 408 is high if data signal 407 is low. Inverse data signal 410 is inverse to data signal 409, wherein inverse data signal 410 is low if data signal 409 is high, and inverse data signal 410 is high if data signal 409 is low. Before point of time 403 and after point of time 406, the inverse bit lines 203a, 203b may be maintained at the high voltage.

During the time interval from point of time 403 to point of time 406, further data signals and inverse data signals may be applied to bit lines and inverse bit lines which are connected to SRAM cells other than SRAM cells 201a, 201b in row 221a of the array 220 which are not shown in FIG. 2 for writing data to all SRAM cells in row 221a.

At a point of time 404, which may be after point of time 403 and before point of time 406, an enable signal 412 may be applied to low voltage switching device 213a for electrically disconnecting the low voltage power supply line 206a from the low voltage terminal 216 of the power supply 214. In embodiments wherein the low voltage switching device 213a comprises an N-channel field effect transistor, the enable signal 412 may be applied by switching a voltage applied to the gate electrode of the N-channel field effect transistor from the high voltage to the low voltage.

At substantially the same point of time 404, an inverse enable signal 413 may be applied to the high voltage switching device 212a for electrically disconnecting the high voltage power supply line 205a from the high voltage terminal 215 of the power supply 214. In embodiments wherein the high voltage switching device 212a comprises a P-channel field effect transistor, the inverse enable signal may be applied by switching a voltage applied to the gate electrode of the P-channel field effect transistor from the low voltage to the high voltage.

By applying the enable signal 412 to the low voltage switching device 213a and the inverse enable signal 413 to the high voltage switching device 212a, the high voltage power supply line 205a and the low voltage power supply line 206a are electrically disconnected from the power source 214. Since the high voltage power supply terminals 208a, 208b of the SRAM cells 201a, 201b in the row 221a are electrically connected to the power source 214 via the high voltage power supply line 205a, the high voltage power supply terminals 208a, 208b are thus electrically disconnected from the power source 214. Similarly, the low voltage power supply terminals 209a, 209b of SRAM cells 201a, 201b are electrically disconnected from power source 214.

A word line signal 411 may be applied to the word line 204a associated with the row 221a of the array 220 wherein the SRAM cells 201a, 201b are provided. This can be done by switching the voltage of the word line 204a from low to high. In embodiments, the word line signal 411 may be applied at the same time 404 at which the high voltage power supply line 205a and the low voltage power supply line 206a are electrically disconnected from the power source 214.

By applying the word line signal 411 to word line 204a, the pass-gate transistors of SRAM cells 201a, 201b are switched into the electrically conductive on-state, so that the voltage applied to the respective bit line electrically connected to each SRAM cell in row 221a is applied to the input of one of the inverters of the SRAM cell, and the voltage applied to the respective inverse bit line electrically connected to each SRAM cell is applied to the input of the other inverter.

In particular, by applying the word line signal 411, the voltage applied to bit line 202a is applied to the input 313 of the first inverter 307 of SRAM cell 201a, and the voltage applied to inverse bit line 203a is applied to the input 314 of the second inverter 308 of SRAM cell 201a. Moreover, as can be seen from the circuit diagram shown in FIG. 3, the voltage of bit line 202a is applied to the output 312 of the second inverter 308, and the voltage of the inverse bit line 303a is applied to the output 311 of the first inverter 307.

Since the SRAM cells 201a, 201b were electrically disconnected from the power source 214 by applying the enable signal 412 and the inverse enable signal 413, there is substantially no electrical connection between the inputs and outputs of the inverters of the SRAM cells 201a, 201b and the power source 214 of the device 200 when the word line signal 411 is applied. Accordingly, the voltages applied to the bit lines 202a, 202b and inverse bit lines 203a, 203b need not overcome the voltage of the power source 214 applied to the input and outputs of the inverters via the pull-up transistors and pull-down transistors.

Hence, compared to the device described above with reference to FIG. 1, the writability of the device 200 may be improved. In contrast to proposals according to the state of the art, wherein more than six transistors are provided in each SRAM cell, an improved writability may be obtained in embodiments of the present disclosure wherein each of the SRAM cells 201a-201d is a six transistor SRAM cell, as described above with reference to FIGS. 2 and 3.

However, the structure of the SRAM cells is not limited to the six-transistor configuration described above with reference to FIGS. 2 and 3. In other embodiments, different configurations of SRAM cells which may optionally comprise more than six transistors may be employed.

Concerning the high voltage switching devices 212a, 212b and the low voltage switching devices 213a, 213b, as described above, in embodiments, a single high voltage switching device and a single low voltage switching device may be provided for each of the rows 221a, 221b of the array 220 of SRAM cells, and each row 221a, 221b may comprise a relatively large number of individual SRAM cells. Thus, the high voltage switching devices 212a, 212b and the low voltage switching devices 213a, 213b do not substantially increase the area on a substrate occupied by device 200, or increase the area of device 200 only to a relatively low extent.

At a point of time 405, which is later than the point of time 404 and earlier than the point of time 406, the enable signal 412 and the inverse enable signal 413 are no longer applied to the high voltage switching device 212a and the low voltage switching device 213a, and, instead, the high voltage switching device 212a and the low voltage switching device 213a may be operated for electrically connecting the high voltage power supply line 205a to the high voltage terminal 215 of power source 214, and for electrically connecting the low voltage power supply line 206a to the low voltage terminal 216 of the power source 214. In embodiments wherein the high voltage switching device 212a comprises a P-channel field effect transistor and the low voltage switching device 213a comprises an N-channel field effect transistor, this can be done by applying the high voltage to the N-channel field effect transistor and applying the low voltage to the P-channel field effect transistor.

Additionally, the word line signal 411 is no longer applied to word line 204a, so that the pass-gate transistors of the SRAM cells 201a, 201b in the row 221a of the array 220 electrically disconnect the inputs and outputs of the inverters of the SRAM cells from the bit lines 202a, 202b and the inverse bit lines 203a. Thus, the SRAM cells 201a, 201b are switched into the standby mode, wherein the SRAM cells 201a, 201b maintain the state into which they were set during the write procedure.

Figure 4B:
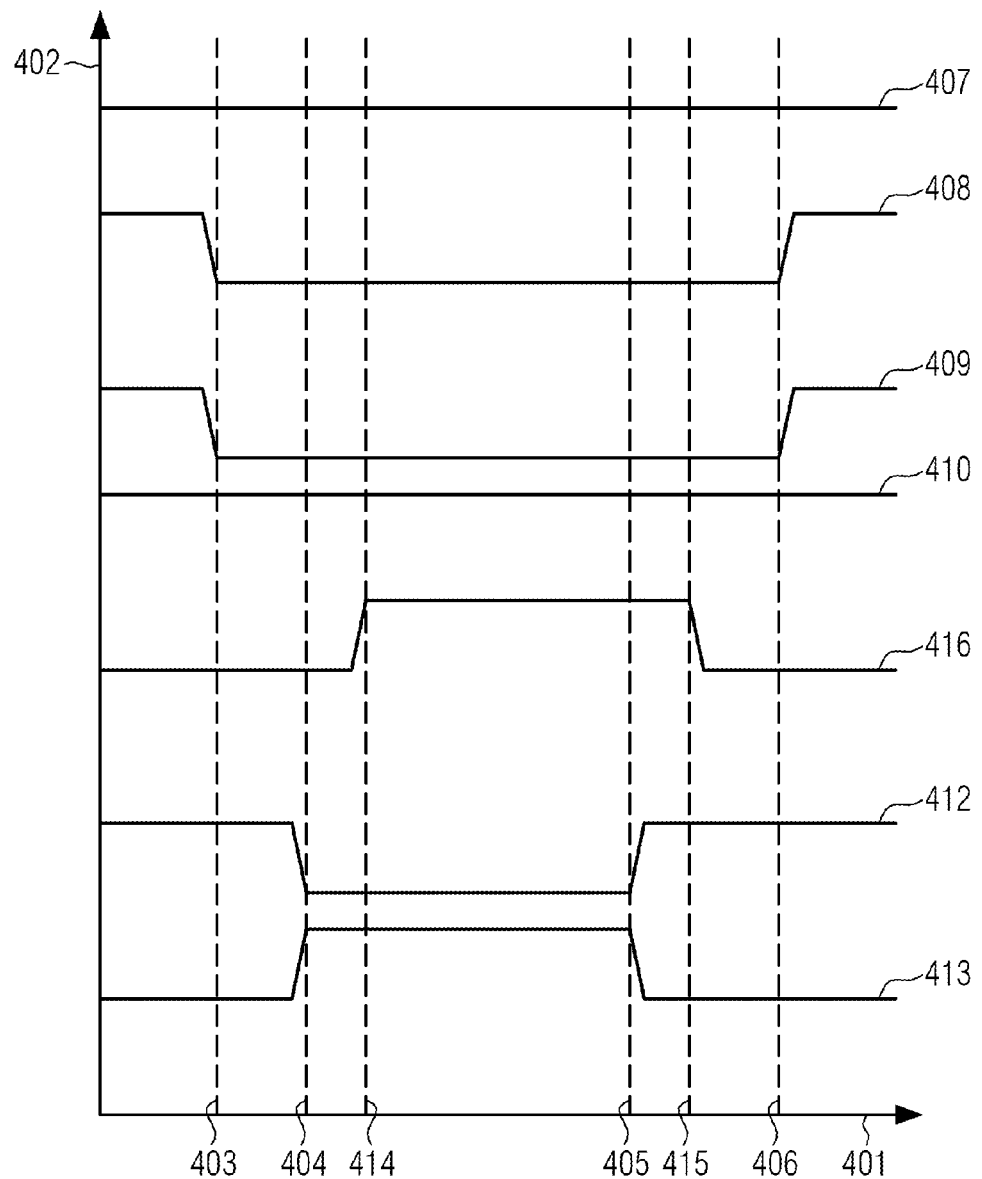
FIG. 4b schematically illustrates signals applied in a method of operating the device of FIG. 2 according to another embodiment.

FIG. 4b shows a graph illustrating signals applied in a method of writing data to SRAM cells in the device 200 according to an embodiment.

Different from the embodiment of FIG. 4a, in the embodiment of FIG. 4b, the word line signal (denoted by reference numeral 416 in FIG. 4b) is applied at a point of time 414 which is later than the point of time 404 at which the enable signal 412 and the inverse enable signal 413 are applied. Moreover, the word line signal 416 may be applied until a point of time 415, which is between the point of time 405 at which the enable signal 412 and the inverse signal 413 are no longer applied, and the point of time 406 at which the data signals and inverse data signals are no longer applied. Thus, in the embodiment of FIG. 4b, applying the enable signal 412 and the inverse enable signal 413 on the one hand, and applying the word line signal 416, on the other hand, are not performed substantially simultaneously.

Further features of the embodiment of FIG. 4b may correspond to the embodiment described above with reference to FIG. 4a.

Due to the capacitance of the high voltage power supply line 205a and the low voltage power supply line 206a, the voltage at the high power supply terminals 208a, 208b of SRAM cells 201a, 201b may require an amount of time for decreasing to a voltage that is substantially lower than the high voltage provided by the power supply 214. Applying the word line signal 416 at the point of time 414 that is later than the point of time 404 at which the enable signal 412 and the inverse enable signal 413 are applied may help to ensure that the word line signal 416 is applied at a point of time at which the voltage difference between the high voltage power supply terminals 208a, 208b and the low voltage power supply terminals 209a, 209b has decreased to a sufficient extent. This may help to further improve the writability of the SRAM cells.

In embodiments, the time interval between the point of time 404 and point of time 415 may have a duration that is selected in accordance with a clock speed of the device 200, which may be in a range from about 1 MHz to about 10 GHz.

Applying the word line signal 416 longer than the enable signal 412 and the inverse enable signal 413 until point of time 415 can help to ensure that the SRAM cells 201a, 201b are in their intended state when the SRAM cells 201a, 201b are electrically connected to the power supply 214 at point of time 415. It could be possible that when the SRAM cells 201a, 201b are electrically connected to the power source 214 at the same time at which the word line signal 416 is turned off, the state of the SRAM cells 201a, 201b may be influenced by leakage currents, and leak away faster than the inverters of SRAM cells 201a, 201b may be powered. Although the likelihood thereof might be relatively low, maintaining the word line signal 416 longer may eliminate the issue.

In the method described above with reference to FIG. 4a, as well as in the method described above with reference to FIG. 4b, data may be written to the SRAM cells in a row of the array 220 of SRAM cells other than the row 221a by applying the enable signal 412 to the low voltage switching device associated with the respective row, applying the inverse enable signal to the high voltage switching device associated with the respective row, and applying the word line signal 411 or 416, respectively, to the word line associated with the respective row of the array 220.

The control circuit 217 may be adapted for carrying out the above-described methods of writing data to SRAM cells in the device 200. In particular, the write control circuit 218 may be adapted for applying the data signals, inverse data signals, enable signal, inverse enable signal and word line signal.

For reading data from one or more of the SRAM cells 201a-201d of the device 200, the bit line and the inverse bit line connected to the SRAM cell may be pre-charged to the high voltage. For example, for reading data from the SRAM cell 201a, the bit line 202a and the inverse bit line 203a may be pre-charged to the high voltage.

Thereafter, the bit line 202a and the inverse bit line 203a may be left electrically floating, and a word line signal similar to the word line signal 411 described above with reference to FIG. 4a may be applied to word line 204a. Thus, the pass-gate transistors 309, 310 are switched into an electrically conductive on-state state, so that the bit line 202a is electrically connected to the output 312 of the second inverter 308, and the inverse bit line 203a is electrically connected to the output 311 of the first inverter 307. This causes a voltage difference between bit line 202a and inverse bit line 203a that depends on the state of the SRAM cell 201a. The voltage difference may be sensed by a sense amplifier (not shown) in control circuit 217 to determine the state of the SRAM cell 201a.

For reading the state of another SRAM cell in the device 200, similar steps may be performed, wherein the bit line, inverse bit line, and word line connected to the respective SRAM cell are used. In embodiments, all SRAM cells in one of the rows 221a, 221b of the array 220 may be read simultaneously.

In embodiments, during the read operation, the high voltage switching devices 212a, 212b and the low voltage switching devices 213a, 213b are not operated, so that the SRAM cells from which data are to be read remain electrically connected to the power source 214.

Further features of methods of reading data from the SRAM cells 201a-201d of the device 200 may correspond to features of the method of reading data from device 100 described above with reference to FIG. 1.

The read control circuit 219 may be adapted to perform the above-described method of reading data.

In embodiments, SRAM cells 201a-201d of device 200 may be optimized for stability. As detailed above, the device 200 may have an improved writability as compared to, for example, the device described above with reference to FIG. 1. Accordingly, the gamma ratio, being a ratio between a conductivity of pass gate transistors 309, 310 in the on state, and a conductivity of pull-up transistors 315, 316 in the on state, which can be critical in a write operation as described above with reference to FIG. 1, is not critical anymore in device 200, or at least less critical. Hence, SRAM cells 201a-201d may be provided with a relatively high beta ratio, being a ratio between the conductivity of their pull-down transistors 317, 318 in the on state and the conductivity of their pass-gate transistors 309, 310 in the on state, which may be helpful for increasing the stability of SRAM cells 201a-201d with respect to read disturbances. Moreover, an alpha ratio of SRAM cells 201a-201d, being a ratio between a conductivity of their pull-up transistors 315, 316 in the on state and a conductivity of their pull-down transistors 317, 318 in the on state may be freely optimized for achieving a desired signal to noise margin. The conductivities of the transistors 201a-201d may be adapted by adapting the width of the channel regions of the transistors.

The present disclosure is not limited to embodiments wherein both a high voltage power supply line and a low voltage power supply line are electrically disconnected from the power source 214 when data are written to SRAM cells. In other embodiments, the low voltage switching devices 213a, 213b may be omitted and the low voltage power supply lines 206a, 206b may remain electrically connected to the low voltage terminal 216 of the power supply 214 when data are written to SRAM cells. In such embodiments, the high voltage switching devices 212a, 212b may be used for electrically disconnecting the high voltage power supply lines 205a, 205b from the high voltage terminal 215 of the power source 214 when data are written to SRAM cells.

In further embodiments, the high voltage switching devices 212a, 212b may be omitted, and the high voltage power supply lines 205a, 205b may remain electrically connected to the high voltage terminal 215 of the power supply 214 when data are written to SRAM cells. In such embodiments, the low voltage switching devices 213a, 213b may be used for electrically disconnecting the low voltage power supply lines 206a, 206b from the low voltage terminal 216 of the power source 214 when data are written to SRAM cells.

Moreover, the present disclosure is not limited to embodiments wherein the device 200 is operated as described above with reference to FIGS. 4a and 4b. In other embodiments, the word line signal 416 may be applied before the enable signal 412 and the inverse enable signal 413 are applied, the enable signal 412 and the inverse enable signal 413 being applied longer than the word line signal 416. In further embodiments, the word line signal 416 may be applied before the enable signal 412 and the inverse enable signal 413 are applied, the word line signal 416 being applied longer than the enable signal 412 and the inverse enable signal 413. In further embodiments, the word line signal 416 may be applied after the enable signal 412 and the inverse enable signal 413 are applied, the enable signal 412 and the inverse enable signal 413 being applied longer than the word line signal 416.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    writing data to one or more static random access memory (SRAM) cells, wherein writing data to the one or more SRAM cells comprises applying a data signal to at least one bit line electrically connected to the one or more SRAM memory cells, electrically disconnecting at least one of a first power supply terminal and a second power supply terminal of each of the one or more SRAM cells from a power supply, and applying a word line signal to a word line electrically connected to the one or more SRAM cells; and
    thereafter electrically connecting the at least one of the first power supply terminal and the second power supply terminal of each of the one or more SRAM cells to the power source.

2. The method of claim 1, wherein electrically disconnecting the at least one of the first power supply terminal and the second power supply terminal of each of the one or more SRAM cells from the power supply and applying the word line signal to the word line are performed substantially simultaneously.

3. The method of claim 2, wherein the word line signal is provided to the word line at least until the at least one of the first power supply terminal and the second power supply terminal of each of the one or more SRAM cells is electrically connected to the power source.

4. The method of claim 1, wherein the word line signal is applied to the word line after electrically disconnecting the at least one of the first power supply terminal and the second power supply terminal of each of the one or more SRAM cells from the power supply.

5. The method of claim 4, wherein the word line signal is provided to the word line for a time interval, and wherein the at least one of the first power supply terminal and the second power supply terminal of each of the one or more SRAM cells is electrically connected to the power source before the end of the time interval.

6. The method of claim 1, wherein the data signal is applied to the at least one bit line before electrically disconnecting the at least one of the first power supply terminal and the second power supply terminal of each of the one or more SRAM cells from the power supply.

7. The method of claim 6, wherein the data signal is provided to the at least one bit line at least until the at least one of the first power supply terminal and the second power supply terminal of each of the one or more SRAM cells is electrically connected to the power source.

8. The method of claim 1, wherein writing data to the one or more SRAM cells further comprises:
    applying an inverse data signal to at least one inverse bit line electrically connected to the one or more SRAM cells, the data signal and the inverse data signal being applied substantially simultaneously.

9. The method of claim 8, further comprising reading data from the one or more SRAM cells, wherein reading data from the one or more SRAM cells comprises:
    pre-charging the at least one bit line and the at least one inverse bit line;
    applying a word line signal to the word line electrically connected to the one or more SRAM cells; and
    for each of the one or more SRAM cells, sensing a voltage difference between one of the at least one bit line electrically connected to the SRAM cell and one of the at least one inverse bit line electrically connected to the SRAM cell;
    wherein the first power supply terminal and the second power supply terminal of each of the one or more SRAM cells remain electrically connected to the power source while the data are read.

10. The method of claim 1, wherein each SRAM cell is a six transistor SRAM cell.

11. A device, comprising:
    a plurality of bit lines;
    a plurality of word lines;
    a plurality of static random access memory (SRAM) cells, each SRAM cell being electrically connected to one of the bit lines and one of the word lines, each SRAM cell having a first power supply terminal and a second power supply terminal;
    a plurality of first switching devices, each first switching device being electrically connected between the first power supply terminal of at least one of the SRAM cells and a power source; and
    a data writing circuit adapted for applying a data signal to each bit line electrically connected to the at least one of the SRAM cells, operating at least one of the first switching devices for electrically disconnecting the first power supply terminal of at least one of the plurality of SRAM cells from the power source, and applying a word line signal to a word line electrically connected to the at least one of the SRAM cells.

12. The device of claim 11, further comprising:
    a plurality of second switching devices, wherein each second switching device is electrically connected between the second power supply terminal of the at least one of the SRAM cells and the power source.

13. The device of claim 11, wherein the plurality of SRAM cells comprises an array of SRAM cells, the array of SRAM cells comprising a plurality of rows, each row comprising two or more SRAM cells, each word line being associated with one of the rows, each SRAM cell being electrically connected to the word line associated with the row wherein the SRAM cell is provided.

14. The device of claim 13, further comprising a plurality of high voltage power supply lines, each high voltage power supply line being associated with one of the rows, the first power supply terminal of each SRAM cell being electrically connected to the high voltage power supply line associated with the row wherein the SRAM cell is provided, each of the first switching devices being electrically connected between one of the high voltage power supply lines and the power source.

15. The device of claim 14, wherein the first power supply terminals of the SRAM cells are high voltage terminals, and wherein each of the first switching devices comprises a P-channel field effect transistor.

16. The device of claim 14, further comprising a plurality of low voltage power supply lines, each low voltage power supply line being associated with one of the rows, the second power supply terminal of each SRAM cell being electrically connected to the low voltage power supply line associated with the row wherein the SRAM cell is provided, the device further comprising a plurality of second switching devices, each of the second switching devices being electrically connected between one of the low voltage power supply lines and the power source.

17. The device of claim 16, wherein the second power supply terminals of the SRAM cells are low voltage terminals, and wherein each of the second switching devices comprises an N-channel field effect transistor.

18. The device of claim 11, further comprising a plurality of inverse bit lines, each SRAM cell being electrically connected to one of the inverse bit lines, wherein said data writing circuit is adapted to apply an inverse data signal to each inverse bit line electrically connected to the at least one of the SRAM cells, wherein the data signal and the inverse data signal are applied substantially simultaneously.

19. The device of claim 18, further comprising a read circuit adapted for precharging the bit line and the inverse bit line electrically connected to at least one of the plurality of SRAM cells, applying a word line signal to a word line electrically connected to the at least one of the plurality of SRAM cells, and sensing a voltage difference between the bit line and the inverse bit line for each of the at least one of the plurality of SRAM cells, wherein the first power supply terminal and the second power supply terminal of each of the at least one of the plurality of SRAM cells remain electrically connected to the power source.

20. The device of claim 11, wherein each SRAM cell is a six transistor SRAM cell.

* * * * *